(12) United States Patent
Tanaka et al.

(10) Patent No.: US 9,686,857 B2
(45) Date of Patent: Jun. 20, 2017

(54) OPTO-ELECTRIC HYBRID MODULE

(71) Applicant: NITTO DENKO CORPORATION, Ibaraki-shi, Osaka (JP)

(72) Inventors: Naoyuki Tanaka, Ibaraki (JP); Yasuto Ishimaru, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/030,184

(22) PCT Filed: Aug. 18, 2014

(86) PCT No.: PCT/JP2014/071520
§ 371 (c)(1),
(2) Date: Apr. 18, 2016

(87) PCT Pub. No.: WO2015/064183
PCT Pub. Date: May 7, 2015

(65) Prior Publication Data
US 2016/0238807 A1 Aug. 18, 2016

(30) Foreign Application Priority Data

Oct. 31, 2013 (JP) .................................. 2013-227370

(51) Int. Cl.
*G02B 6/42* (2006.01)
*H05K 1/02* (2006.01)
(Continued)

(52) U.S. Cl.
CPC ............. *H05K 1/0274* (2013.01); *G02B 6/42* (2013.01); *G02B 6/4281* (2013.01);
(Continued)

(58) Field of Classification Search
None
See application file for complete search history.

(56) References Cited

U.S. PATENT DOCUMENTS 5,659,648 A * 8/1997 Knapp ................. G02B 6/1221
 385/129
6,343,164 B1 * 1/2002 Robertsson .......... G02B 6/1221
 385/131
(Continued)

FOREIGN PATENT DOCUMENTS

| JP | 2010-60821 A | 3/2010 |
| JP | 2010-190994 A | 9/2010 |
| JP | 2012-133241 A | * 7/2012 |

OTHER PUBLICATIONS

Notification of Transmittal of Translation of the International Preliminary Report on Patentability (Form PCT/IB/338) issued in counterpart International Application No. PCT/JP2014/071520 mailed May 12, 2016 with Forms PCT/IB/373 and PCT/ISA/237. (10 pages).

(Continued)

*Primary Examiner* — Mike Stahl
(74) *Attorney, Agent, or Firm* — Westerman, Hattori, Daniels & Adrian, LLP

(57) ABSTRACT

An opto-electric hybrid module is provided. In the opto-electric hybrid module, a core and an electric circuit including electric circuit body portions and mounting pads are provided on a surface of an under-cladding layer of an optical waveguide. An optical element is mounted on the mounting pads with its electrodes in abutment against the mounting pads. The core is covered with the over-cladding layer, and a center portion of the optical element is positioned above a portion of the over-cladding layer covering a top surface of the core. A portion of the electric circuit excluding the mounting pads and a surface portion of the under-cladding layer present between the electric circuit body portions of the electric circuit and present between the electric circuit body portion and the mounting pad are (Continued)

covered with a core material layer formed of the same material as the core.

2 Claims, 4 Drawing Sheets

(51) Int. Cl.
  *G02B 6/122* (2006.01)
  *G02B 6/138* (2006.01)
(52) U.S. Cl.
  CPC ............ *G02B 6/4283* (2013.01); *G02B 6/122* (2013.01); *G02B 6/138* (2013.01); *G02B 6/423* (2013.01); *G02B 6/4214* (2013.01); *G02B 6/4245* (2013.01)

(56) References Cited

U.S. PATENT DOCUMENTS

| | | | | |
|---|---|---|---|---|
| 6,741,781 B2 * | 5/2004 | Furuyama | ............ | G02B 6/125 385/129 |
| 2003/0128907 A1 * | 7/2003 | Kikuchi | ................ | G02B 6/138 385/14 |
| 2010/0209054 A1 | 8/2010 | Hodono | | |
| 2010/0323297 A1 * | 12/2010 | Yanagisawa | ............. | G02B 6/43 430/315 |
| 2011/0274388 A1 * | 11/2011 | Yamamoto | ............... | G02B 6/43 385/14 |
| 2013/0236138 A1 * | 9/2013 | Yamamoto | ........... | G02B 6/4214 385/14 |
| 2013/0272648 A1 * | 10/2013 | Terada | ..................... | G02B 6/43 385/14 |
| 2016/0178863 A1 * | 6/2016 | Tanaka | ................. | G02B 6/4214 385/14 |

OTHER PUBLICATIONS

International Search Report dated Nov. 11, 2014, issued in counterpart International Application No. PCT/JP2014/071520 (1 page).

* cited by examiner

OPTO-ELECTRIC HYBRID MODULE

TECHNICAL FIELD

The present invention relates to an opto-electric hybrid module which includes an optical waveguide, an electric circuit provided directly on the optical waveguide, and an optical element mounted on the electric circuit.

BACKGROUND ART

Opto-electric hybrid modules are typically produced by: individually producing a flexible circuit board including an electric circuit provided on a surface of an insulation layer and covered with a cover lay of an insulative resin, and an optical waveguide including an under-cladding layer, a core and an over-cladding layer stacked in this order; bonding a back surface of the insulation layer of the flexible circuit board to a surface of the over-cladding layer of the optical waveguide with an adhesive agent; and mounting an optical element on a predetermined portion (mounting pads) of the electric circuit. The opto-electric hybrid modules are flexible, and are advantageous for use in a bent state in a small space and for use in a movable portion such as a hinge portion to meet a recent demand for size reduction of electronic devices and the like.

An opto-electric hybrid module as shown in a transverse sectional view of FIG. 5 (see, for example, PTL 1) is also proposed, in which an electric circuit including a plurality of electric circuit body portions 4 and mounting pads 4a is provided on a surface of an under-cladding layer 11 of an optical waveguide W1 to reduce a distance between an optical element 5 and a core 12 for improvement of the optical coupling efficiency between the optical element 5 and the core 12. In the opto-electric hybrid module, the electric circuit body portions 4 are covered with a cladding material layer 13a formed of the same material as an over-cladding layer 13. The cladding material layer 13a has a top surface flush with a top surface of the over-cladding layer 13. In FIG. 5, a reference character 12a designates positioning guides formed of the same material as the core 12 and surrounding mounting pads 4a for positioning electrodes 5a of the optical element 5 with respect to the mounting pads 4a.

RELATED ART DOCUMENT

Patent Document

PTL 1: JP-A-2010-190994

SUMMARY OF INVENTION

The opto-electric hybrid modules are generally required to be lightweight and flexible. The conventional opto-electric hybrid module shown in FIG. 5 is imparted with lighter weight and higher flexibility by forming the electric circuit body portion 4 on the surface of the under-cladding layer 11 and covering the electric circuit body portion 4 with the cladding material layer 13a formed of the same material as the over-cladding layer 13, but is still required to be more lightweight and more flexible.

In view of the foregoing, it is an object of the present invention to provide an opto-electric hybrid module which is lightweight and more flexible with its electric circuit covered with a thin layer.

According to the present invention to achieve the above object, there is provided an opto-electric hybrid module, which includes: an optical waveguide including an under-cladding layer, a linear light-path core provided on a core formation portion of a surface of the under-cladding layer as projecting from the surface of the under-cladding layer, and an over-cladding layer covering only the core; an electric circuit provided directly on the optical waveguide and including mounting pads; and an optical element mounted on the mounting pads; wherein the optical element is positioned at a predetermined position above a portion of the over-cladding layer covering a top surface of the light-path core; wherein the electric circuit is provided on a portion of the surface of the under-cladding layer other than the core formation portion and is covered with a core material layer formed of the same material as the core.

In the inventive opto-electric hybrid module, the electric circuit is provided on the surface of the under-cladding layer. This makes it possible to form the core after formation of the electric circuit. Therefore, a portion of the electric circuit excluding the mounting pads can be covered with the core material when the core is formed. Further, only the light-path core is covered with the over-cladding layer. Since the core material layer covering the electric circuit does not function as a light path, there is no need to cover the core material layer with the over-cladding layer for prevention of leakage of light from the core material layer. With this arrangement, the top surface of the over-cladding layer is located at a higher level than the top surface of the core. Therefore, the core material layer covering the electric circuit in the present invention has a smaller thickness than the over-cladding material layer covering the electric circuit in the conventional embodiment (see FIG. 5). As a result, the inventive opto-electric hybrid module is more flexible and more lightweight.

Particularly, peripheral portions of the mounting pads excluding center portions may be covered with the core material layer, and inner peripheral walls of the core material layer present on the peripheral portions of the mounting pads may serve as positioning guides for positioning electrodes of the optical element. The electrodes of the optical element are respectively positioned on the center portions of the mounting pads by utilizing the positioning guides. In this case, the optical element is mounted with higher positioning accuracy, thereby improving the light transmission efficiency between the optical element and the core.

DESCRIPTION OF EMBODIMENTS

Embodiments of the present invention will hereinafter be described in detail based on the attached drawings.

Figure 1A:
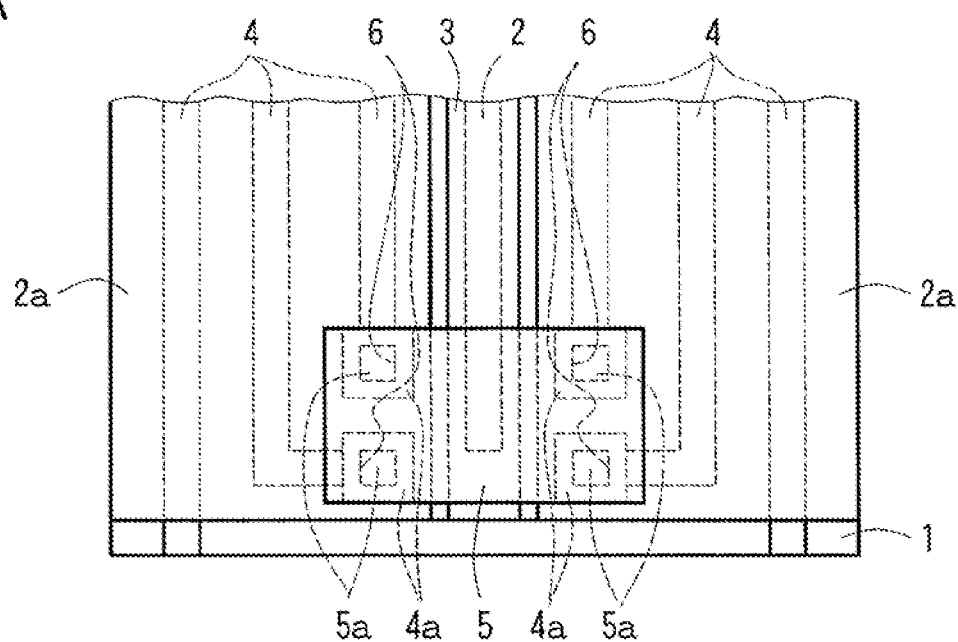
FIGS. 1A and 1B are a plan view and a transverse sectional view, respectively, schematically illustrating a major portion of an opto-electric hybrid module according to one embodiment of the present invention.
Figure 1B:
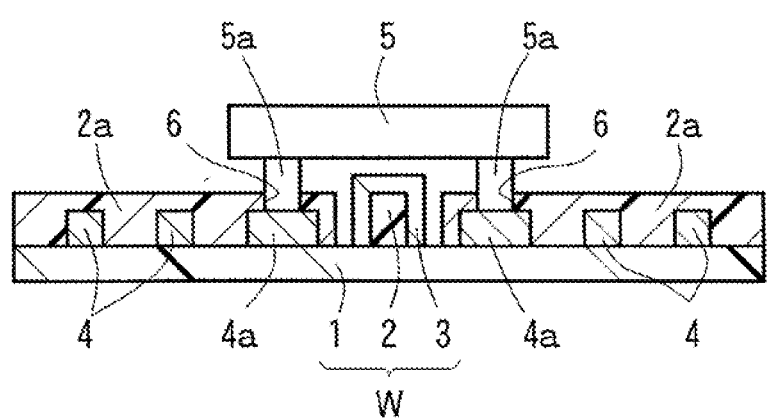

FIGS. 1A and 1B are a plan view and a transverse sectional view, respectively, schematically illustrating an end portion (major portion) of an opto-electric hybrid module according to one embodiment of the present invention. In the opto-electric hybrid module according to this embodiment, a linear light-path core 2 is provided on a core formation portion of a surface of an under-cladding layer 1 of an optical waveguide W as projecting from the surface of the under-cladding layer 1, and an electric circuit including a plurality of electric circuit body portions 4 and mounting pads 4a is provided on a portion of the surface of the under-cladding layer 1 other than the core formation portion. An optical element 5 is mounted on the mounting pads 4a with its electrodes 5a in abutment against the mounting pads 4a. The light-path core 2 is covered with an over-cladding layer 3, and a center portion of the optical element 5 is positioned above a portion of the over-cladding layer 3 covering a top surface of the core 2. A portion of the electric circuit excluding center portions of the mounting pads 4a and a surface portion of the under-cladding layer 1 present between the plurality of electric circuit body portions 4 of the electric circuit and present between the electric circuit body portion 4 and the mounting pad 4a are covered with a core material layer 2a formed of the same material as the core 2.

As described above, the electric circuit is covered with the core material layer 2a which has a smaller thickness than the over-cladding layer 3. Therefore, the core material layer 2a covering the electric circuit is thinner than the cladding material layer 13a formed of the same material as the over-cladding layer 13 to cover the electric circuit in the conventional embodiment shown in FIG. 5. As a result, the opto-electric hybrid module according to this embodiment is more flexible and more lightweight as compared with the conventional opto-electric hybrid module shown in FIG. 5.

In this embodiment, peripheral portions of the mounting pads 4a are covered with the core material layer 2a, and the center portions of the mounting pads 4a are uncovered. Thus, the core material layer 2a has inner peripheral walls 6 present on the peripheral portions of the mounting pads 4a. When the optical element 5 is mounted on the mounting pads 4a, the inner peripheral walls 6 of the core material layer 2a serve as guides for positioning the electrodes 5a of the optical element 5 on the center portions of the mounting pads 4a. This increases the positioning accuracy of the optical element 5 in the opto-electric hybrid module, thereby ensuring a higher light transmission efficiency between the optical element 5 and the core 2.

The opto-electric hybrid module may be produced, for example, in the following manner.

First, a flat base 10 (see FIG. 2A) to be used for formation of an under-cladding layer 1 thereon is prepared. Exemplary materials for the base 10 include metals such as stainless steel, glass, quartz, silicon and resins.

Figure 2A:
FIG. 2A is a schematic diagram for explaining a method of forming an under-cladding layer of an optical waveguide of the opto-electric hybrid module.

Then, as shown in a transverse sectional view of FIG. 2A, the under-cladding layer 1 is formed in a flat shape on a surface of the base 10. Exemplary materials for the under-cladding layer 1 include photosensitive resins and thermosetting resins. The formation of the under-cladding layer 1 may be achieved by a formation method suitable for the material to be used. The under-cladding layer 1 has a thickness of, for example, 1 to 100 μm.

Figure 2B:
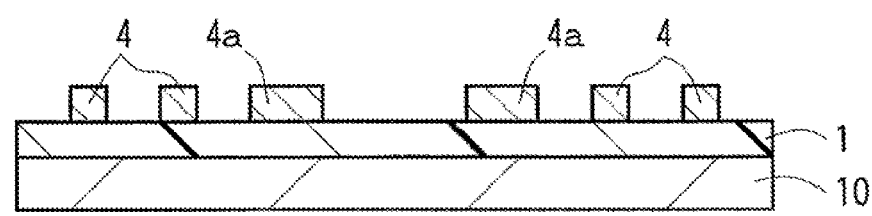
FIG. 2B is a schematic diagram for explaining a method of forming an electric circuit of the opto-electric hybrid module.

Next, as shown in a transverse sectional view of FIG. 2B, an electric circuit including electric circuit body portions 4 and mounting pads 4a is formed on a surface of the under-cladding layer 1, for example, by a semi-additive method.

Figure 2C:
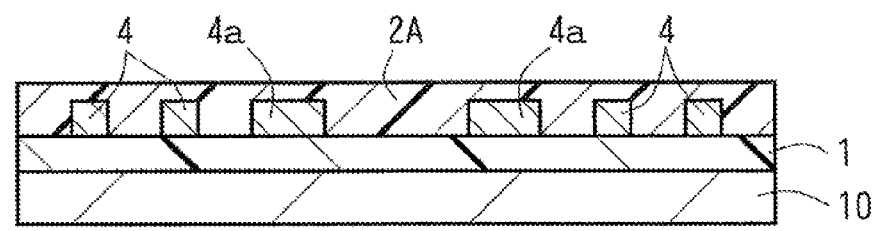
FIGS. 2C and 2D are schematic diagrams for explaining a method of forming a light-path core of the optical waveguide and a core material layer covering the electric circuit.

Then, as shown in a transverse sectional view of FIG. 2C, a photosensitive resin for core formation is applied on the surface of the under-cladding layer 1 as covering the electric circuit 4, whereby a photosensitive resin layer 2A is formed. Thereafter, the photosensitive resin layer 2A is dried. In this embodiment, the photosensitive resin for the core formation has a solvent content of not greater than 15 wt %. Thus, when the photosensitive resin layer 2A is dried, a smaller amount of solvent is evaporated from the photosensitive resin layer 2A, so that the thickness of the photosensitive resin layer 2A is hardly reduced. Therefore, the photosensitive resin layer 2A has a planar surface.

Figure 2D:
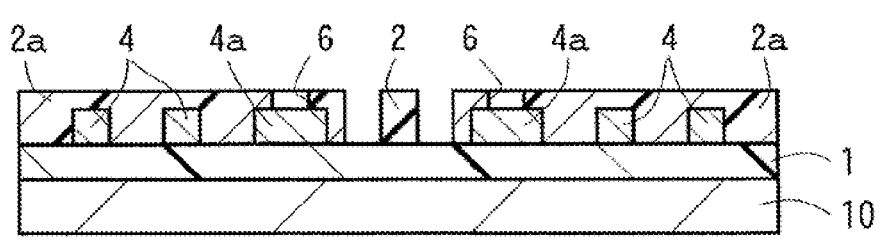

In turn, as shown in a transverse sectional view of FIG. 2D, a portion of the photosensitive resin layer 2A between the mounting pads 4a is formed into a core 2, and a portion of the photosensitive resin layer 2A covering a portion of the electric circuit other than the center portions of the mounting pads 4a is formed into a core material layer 2a by a photolithography process. At this time, the core material layer 2a has inner peripheral walls 6 present on the peripheral portions of the mounting pads 4a of the electric circuit. The core 2 has a height of 5 to 100 μm and a width of 5 to 100 μm, for example.

Figure 3A:
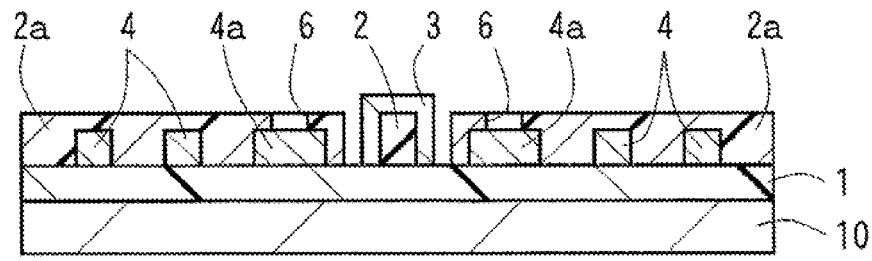
FIG. 3A is a schematic diagram for explaining a method of forming an over-cladding layer of the optical waveguide.

Subsequently, as shown in a transverse sectional view of FIG. 3A, an over-cladding layer 3 is formed as covering the light-path core 2 by a photolithography process. The core material layer 2a is not covered with the over-cladding layer 3. The over-cladding layer 3 has a thickness (film thickness) of, for example, 1 to 50 μm.

Figure 3B:
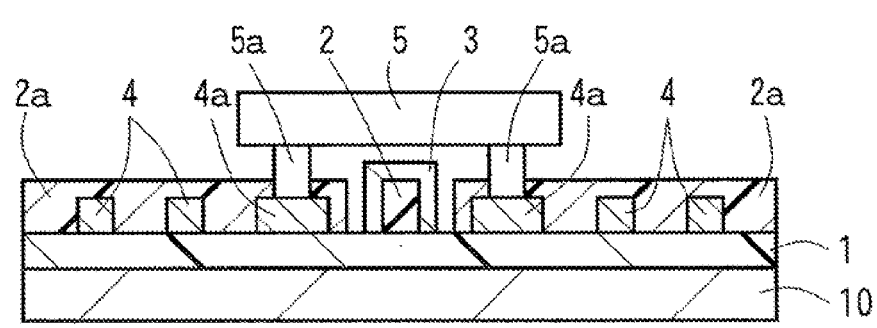
FIG. 3B is a schematic diagram for explaining a method of mounting an optical element of the opto-electric hybrid module.

Then, as shown in a transverse sectional view of FIG. 3B, an optical element 5 is mounted on the mounting pads 4a with lower end faces of electrodes 5a thereof in abutment against top surfaces of the mounting pads 4a of the electric circuit. At this time, the inner peripheral walls 6 of the core material layer 2a (see FIG. 3A) serve as positioning guides for positioning the electrodes 5a of the optical element 5. Therefore, the electrodes 5a of the optical element 5 can be properly positioned on the center portions of the mounting pads 4a. Thus, the optical element 5 can be positioned with higher positioning accuracy. With the optical element 5 thus mounted, a center portion of the optical element 5 is positioned above a portion of the over-cladding layer 3 covering a top surface of the light-path core 2.

Figure 3C:
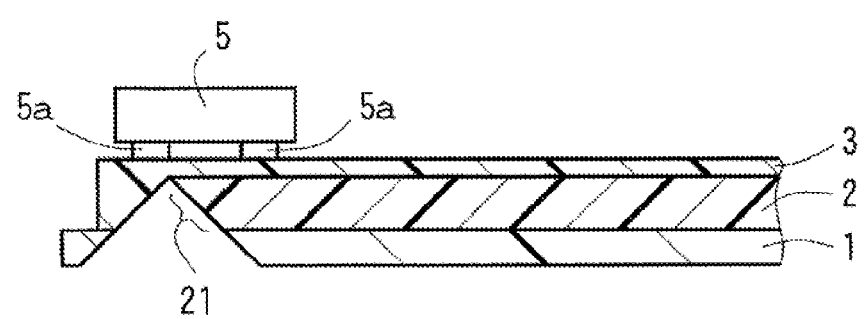
FIG. 3C is a schematic diagram for explaining a method of forming a light reflecting surface on the core.

Subsequently, as shown in a longitudinal sectional view of FIG. 3C, the base 10 (see FIG. 3B) is removed from a back surface of the under-cladding layer 1, and then a predetermined portion of the core 2 is cut off from a back side of the under-cladding layer 1 by means of a cutting blade or by laser processing. Thus, a light reflecting surface 21 inclined at 45 degrees with respect to an axis of the light-path core 2 is formed. The light reflecting surface 21 reflects light to deflect a light path for light transmission between the core 2 and the optical element 5. Thus, the opto-electric hybrid module is produced.

Figure 4:
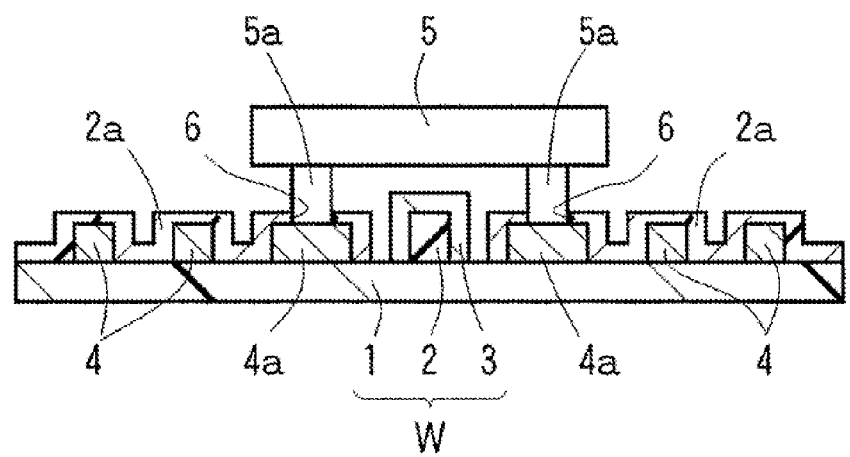
FIG. 4 is a transverse sectional view schematically illustrating an opto-electric hybrid module according to another embodiment of the present invention.

FIG. 4 is a transverse sectional view schematically illustrating an end portion (major portion) of an opto-electric hybrid module according to another embodiment of the present invention. In this embodiment, the top surface of a portion of the core material layer 2a present between the electric circuit body portions 4 of the electric circuit and present between the electric circuit body portion 4 and the mounting pad 4a is located at a lower level with respect to the surface of the under-cladding layer 1 than the top surface of a portion of the core material layer 2a present on the electric circuit (including the plurality of electric circuit body portions 4 and the mounting pads 4a). This opto-electric hybrid module has substantially the same construction as in the embodiment described above with reference to FIGS. 1A and 1B except the aforementioned arrangement, and like components are designated by like reference characters.

In this embodiment, the thickness of the portion of the core material layer 2a present between the electric circuit body portions 4 of the electric circuit and present between the electric circuit body portion 4 and the mounting pad 4a is smaller than in the embodiment described above with reference to FIGS. 1A and 1B. Therefore, the opto-electric hybrid module is more flexible and more lightweight.

In this embodiment, the photosensitive resin for the core formation has a solvent content of not less than 25 wt %. When the photosensitive resin layer 2A is dried, a greater amount of solvent is evaporated from the photosensitive resin layer 2A, and the thickness of the photosensitive resin layer 2A is reduced at a constant percentage. At this time, the thickness of the photosensitive resin layer 2A before the drying is greater between the electric circuit body portions 4 of the electric circuit and between the electric circuit body portion 4 and the mounting pad 4a than on the electric circuit (including the plurality of electric circuit body portions 4 and the mounting pads 4a), so that the reduction in the thickness of the photosensitive resin layer 2A by the drying is greater between the electric circuit body portions 4 of the electric circuit and between the electric circuit body portion 4 and the mounting pad 4a than on the electric circuit. Therefore, as described above, the top surface of the portion of the core material layer 2a present between the electric circuit body portions 4 of the electric circuit and present between the electric circuit body portion 4 and the mounting pad 4a is located at a lower level than the top surface of the portion of the core material layer 2a present on the electric circuit. In FIG. 4, the mounting pads 4a are illustrated as being spaced a greater distance for easy understanding but, actually, the distance between the mounting pads 4a is small (not greater than 200 μm). Therefore, the thickness of the portion of the photosensitive resin layer 2A present between the mounting pads 4a (later serving as the light-path core 2) is not significantly reduced by the drying because of the surface tension of the photosensitive resin and other influences.

In this embodiment, the photosensitive resin layer 2A formed by applying the photosensitive resin preferably has a thickness of not less than 25 μm as measured from the top surface of the electric circuit (including the plurality of electric circuit body portions 4 and the mounting pads 4a) in order to prevent the electric circuit (particularly, edges of the electric circuit) from being partly uncovered when the thickness of the photosensitive resin layer 2A is reduced by the drying.

In the embodiments described above, the peripheral portions of the mounting pads 4a are covered with the core material layer 2a, and the inner peripheral walls 6 of the core material layer 2a serve as the positioning guides for positioning of the electrodes 5a of the optical element 5. In some cases, there is no need to form the positioning guides.

In the embodiments described above, a space defined between the over-cladding layer 3 and the optical element 5 may be sealed with a sealing resin.

Next, an example of the present invention will be described in conjunction with a conventional example. However, it should be understood that the present invention be not limited to the inventive example.

EXAMPLE

[Material for Under-Cladding Layer and Over-Cladding Layer]

A material for the under-cladding layer and the over-cladding layer was prepared by mixing 80 parts by weight of a modified aliphatic epoxy resin (EPICLONEXA-4816 available form DIC Corporation), 20 parts by weight of an aliphatic epoxy resin (EHPE-3150 available from Daicel Chemical Industries, Ltd.), 2 parts by weight of a photo-acid generator (SP170 available from Adeka Corporation) and 40 parts by weight of ethyl lactate (solvent available from Musashino Chemical Laboratory, Ltd.)

[Material for Core]

A material for the core was prepared by mixing 50 parts by weight of o-cresol novolak glycidyl ether (YDCN-700-10 available from Nippon Steel & Sumikin Chemical Co., Ltd.), 50 parts by weight of bisphenoxyethanol fluorene diglycidyl ether (OGSOL EG available from Osaka Gas Chemicals Co., Ltd.), 1 part by weight of a photo-acid generator (SP170 available from Adeka Corporation) and 15 parts by weight of ethyl lactate (solvent available from Musashino Chemical Laboratory, Ltd.)

With the use of the aforementioned materials, an opto-electric hybrid module as shown in FIGS. 1A and 1B was produced in the same manner as in the aforementioned embodiment. The under-cladding layer had a thickness of 15 μm. The core and the core material layer each had a thickness of 35 μm, and the core had a width of 30 μm. The over-cladding layer had a thickness of 15 μm, and the copper electric circuit (including the plurality of electric circuit body portions and the mounting pads) had a thickness of 10 μm. The portion of the core material layer covering the copper electric circuit (the portion of the core material layer present on the top surface of the copper electric circuit) had a thickness of 25 μm (=the thickness of the core material layer (35 μm)−the thickness of the copper electric circuit (10 μm)).

[Conventional Example]

Figure 5:
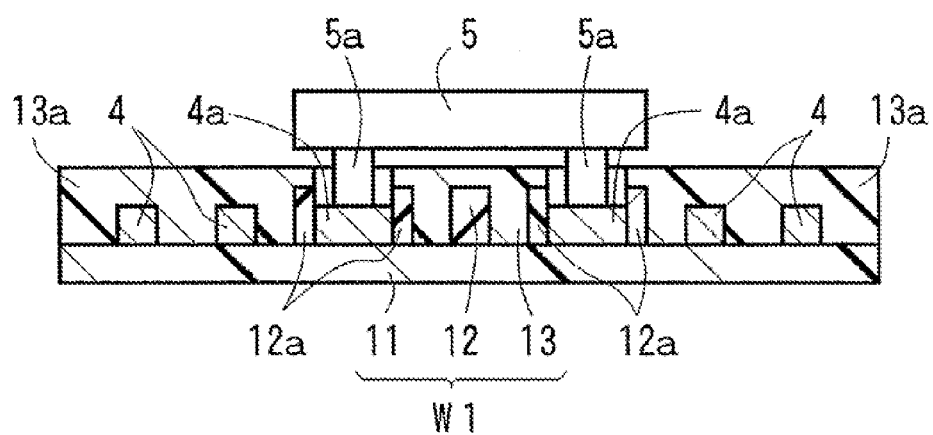
FIG. 5 is a transverse sectional view schematically illustrating a conventional opto-electric hybrid module.

A conventional opto-electric hybrid module as shown in FIG. 5 was produced. The thicknesses of the under-cladding layer and the like were the same as those in the inventive example. The portion of the cladding material layer covering the copper electric circuit (the portion of the cladding material layer present on the top surface of the copper electric circuit) had a thickness of 40 μm (=the thickness of the core (35 μm)+the thickness of the over-cladding layer (15 μm)−the thickness of the copper electric circuit (10 μm)).

The core material layer covering the copper electric circuit in the opto-electric hybrid module of the inventive example had a smaller thickness than the cladding material layer covering the copper electric circuit in the opto-electric hybrid module of the comparative example. This indicates that the opto-electric hybrid module of the inventive example had higher flexibility and lighter weight than the opto-electric hybrid module of the comparative example.

An opto-electric hybrid module as shown in FIG. 4 was also produced, and substantially the same results as in the above inventive example were provided.

While specific forms of the embodiments of the present invention have been shown in the aforementioned inventive examples, the inventive examples are merely illustrative of the invention but not limitative of the invention. It is contemplated that various modifications apparent to those skilled in the art could be made within the scope of the invention.

The inventive opto-electric hybrid module is lightweight and more flexible with its electric circuit covered with the thin layer.

REFERENCE SIGNS LIST

W: OPTICAL WAVEGUIDE
1: UNDER-CLADDING LAYER
2: CORE
2a: CORE MATERIAL LAYER
3: OVER-CLADDING LAYER
4: ELECTRIC CIRCUIT BODY PORTION
4a: MOUNTING PAD
5: OPTICAL ELEMENT
5a: ELECTRODE

What is claimed is:

1. An opto-electric hybrid module comprising:
an optical waveguide including an under-cladding layer, a linear light-path core provided on a core formation portion of a surface of the under-cladding layer as projecting from the surface of the under-cladding layer, and an over-cladding layer covering only the core;
an electric circuit provided directly on the under-cladding layer and including mounting pads; and
an optical element mounted on the mounting pads;
wherein the optical element is positioned at a predetermined position above a portion of the over-cladding layer covering a top surface of the light-path core;
wherein the electric circuit is provided on a portion of the surface of the under-cladding layer other than the core formation portion and is covered with a core material layer formed of the same material as the core.

2. The opto-electric hybrid module according to claim 1, wherein peripheral portions of the mounting pads excluding center portions are covered with the core material layer, and inner peripheral walls of the core material layer present on the peripheral portions of the mounting pads serve as positioning guides for positioning electrodes of the optical element;
wherein the electrodes of the optical element are respectively positioned on the center portions of the mounting pads by utilizing the positioning guides.

* * * * *